(12) United States Patent
Lee et al.

(10) Patent No.: US 8,872,583 B2
(45) Date of Patent: Oct. 28, 2014

(54) POWER AMPLIFIER WITH ADVANCED LINEARITY

(75) Inventors: Chong Min Lee, Seoul (KR); Chul Hun Seo, Seoul (KR)

(73) Assignees: Electronics and Telecommunications Research Institute, Daejeon-si (KR); Soongsil University Foundation of University-Industry Cooperation, Seoul (KR)

( * ) Notice: Subject to any disclaimer, the term of this patent is extended or adjusted under 35 U.S.C. 154(b) by 23 days.

(21) Appl. No.: 13/407,892

(22) Filed: Feb. 29, 2012

(65) Prior Publication Data

US 2012/0262234 A1 Oct. 18, 2012

(30) Foreign Application Priority Data

Apr. 12, 2011 (KR) ........................ 10-2011-0033655

(51) Int. Cl.
 *H03F 1/30* (2006.01)
(52) U.S. Cl.
 USPC .......................................... 330/149; 330/302
(58) Field of Classification Search
 USPC ............... 330/124 R, 149, 295, 302
 See application file for complete search history.

(56) References Cited

U.S. PATENT DOCUMENTS

| | | | |
|---|---|---|---|
| 6,281,755 B1 * | 8/2001 | Feld et al. ...................... 330/302 |
| 6,392,491 B1 * | 5/2002 | Ohkawa et al. ................ 330/149 |
| 7,440,729 B2 * | 10/2008 | Solski et al. .................... 455/46 |
| 7,508,283 B2 | 3/2009 | Itoh et al. | |
| 7,773,956 B2 * | 8/2010 | Fukamachi et al. ............ 455/78 |
| 8,014,443 B2 * | 9/2011 | Nakamura et al. ............ 330/149 |
| 8,040,182 B2 * | 10/2011 | Horiguchi et al. ............ 330/149 |
| 8,076,994 B2 * | 12/2011 | Farrell et al. .................... 333/32 |
| 8,154,340 B2 * | 4/2012 | Dupuy et al. .................. 330/302 |
| 8,330,551 B2 * | 12/2012 | Lim et al. ...................... 330/302 |
| 2003/0107434 A1 * | 6/2003 | Mitzlaff ........................ 330/149 |
| 2013/0187712 A1 * | 7/2013 | Cabanillas et al. ........... 330/192 |

FOREIGN PATENT DOCUMENTS

| | | |
|---|---|---|
| JP | 2008-199625 A | 8/2008 |
| KR | 1020100048832 A | 5/2010 |

OTHER PUBLICATIONS

Hitoshi Sumi; et al; "Ku-Band, 120-W Power Amplifier Using Gallium Nitride FETs", Microwave Symposium Digest, 2009, MTT '09. IEE MTT-S Inernational; Jun. 7-12, 2009, pp. 1389-1392.

Jaewon Choi, et al; "Low Phase Noise VCO using Output Matching Network Based on Harmonic Control Circuit", Microwave Conference, 2008, APMC. Asia-Pacific; Dec. 16-20, 2008; pp. 1-5.

Jaewon Choi, et al; "Dual-Band High-Efficiency Class-F Power Amplifier using Composite Right/Left-Handed Transmission Line", Institute of Electronic Engineering; Aug. 2008, Part No. 8, No. 45 TC 53; 7 pages.

* cited by examiner

*Primary Examiner* — Khanh V Nguyen
(74) *Attorney, Agent, or Firm* — Ladas & Parry LLP (57) ABSTRACT

An amplifier is provided. The amplifier includes an input matching unit suppressing harmonic components of an input signal; a high power amplification unit amplifying a signal suppressed by the input matching unit; and an output matching unit suppressing harmonic components of an output signal amplified by the high power amplification unit.

13 Claims, 10 Drawing Sheets

S(2,1) Level :
fo : -1.67 dB, 2fo : -43.13 dB, 3fo : -47.63

3-Arm 90° Hybrid Coupler (a)

POWER AMPLIFIER WITH ADVANCED LINEARITY

CROSS-REFERENCE TO RELATED APPLICATIONS

This application claims the benefit of priority of Korean Patent Application No. 10-2011-0033655 filed on Apr. 12, 2011, which is incorporated by reference in their entirety herein.

BACKGROUND OF THE INVENTION

1. Field of the invention

The present invention relates to a power amplifier, and more particularly, to a power amplifier with more advanced linear characteristics.

2. Related Art

In various wireless communication systems, a wireless apparatus represented by user equipment, a base station, or the like, includes an amplifier. Research into the power amplifier that is an important barometer in the wireless communication system has been continued so as to improve a gain of output power, linearity and efficiency of output power, or the like. As a result, the power amplifier needs to satisfy high frequency conditions and high output conditions with the improved material characteristics of devices such as gallium arsenide (GaAs), gallium nitride (GaN) field effect transistor (FET), or the like.

The amplifier included in the wireless apparatus is an apparatus that amplifies and transmits a radio frequency (RF) signal to be transmitted. The amplifier may be set to ensure a pre-determined gain value, amplify the signal by the gain value and transmit the amplified signal when receiving the signal. The amplifier may be considered as having linearity in a specific frequency band, but may have non-linearity by losing the linear characteristics according to the size of the input signal or the frequency band of the input signal. When the amplifier has non-linearity, it is difficult for the wireless apparatus to normally transmit the RF signal to be transmitted and a receiver is difficult to receive and analyze the corresponding RF signal and thus, difficult to perform normal communication. Therefore, a need exists for an apparatus and a method for changing non-linearity of the amplifier into linearity, in connection with the characteristics of the amplifier included in the wireless apparatus.

SUMMARY OF THE INVENTION

The present invention provides a power amplifier having linearity by coupling a predistortion unit and a matching unit with the power amplifier.

In an aspect, an amplifier is provided. The amplifier includes an input matching unit suppressing harmonic components of an input signal; a high power amplification unit amplifying a signal suppressed by the input matching unit; and an output matching unit suppressing harmonic components of an output signal amplified by the high power amplification unit.

The input matching unit and the output matching unit may have frequency characteristics of a notch filter.

The input matching unit and the output matching unit may have a meta electromagnetic wave structure.

The input matching unit and the output matching unit may have a composite right/left handed (CRLH) structure.

The input matching unit and the output matching unit may have a two-stage CRLH structure.

In an another aspect, an amplifier is provided. The amplifier includes a predistortion unit suppressing intermodulation distortion; and a power amplification unit amplifying power of an amplification target signal passing through the predistortion unit. The power amplification unit has a parallel amplifier structure in which a first amplification unit and a second amplification unit are coupled with each other in parallel. The first amplification unit and the second amplification unit each include: an input matching unit suppressing harmonic components of the amplification target signal; a high power amplification unit amplifying a signal suppressed by the input matching unit; and an output matching unit suppressing the harmonic components of an output signal amplified by the high power amplification unit.

The predistortion unit may include a phase shifter that shifts a phase of third intermodulation distortion component of a signal input to the predistortion unit by 180°.

The input matching unit and the output matching unit may have frequency characteristics of a notch filter.

The input matching unit and the output matching unit may have a meta electromagnetic wave structure.

The input matching unit and the output matching unit may have a composite right/left handed (CRLH) structure.

The input matching unit and the output matching unit may have a two-stage CRLH structure.

DESCRIPTION OF EXEMPLARY EMBODIMENTS

Hereinafter, embodiments of the present invention will be described in detail with reference to the accompanying drawings so that those skilled in the art may easily practice the present invention. However, the present invention may be modified in various different ways and is not limited to the embodiments provided in the present description. In the accompanying drawings, portions unrelated to the description will be omitted in order to obviously describe the present invention, and similar reference numerals will be used to describe similar portions throughout the present specification.

Throughout the present specification, unless explicitly described to the contrary, "comprising" any components will be understood to imply the inclusion of other elements rather than the exclusion of any other elements. Terms such as "part", "module", "unit" or the like, described in the specification mean a unit of processing at least one function or operation and may be implemented by hardware or software or a combination of hardware and software.

In order to obtain maximum power efficiency, a power amplifier is operated in the vicinity of a saturation region of a transistor. Since the amplifier has characteristics of non-linearity, harmonics are generated. Further, an output frequency component combined by a sum and a difference of the plurality of harmonic components generates an intermodulation signal. The harmonic component and intermodulation signal occur a serious distortion in an output signal of the amplifier of the RF signal. Therefore, in using the power amplifier, a need exists for an apparatus capable of improving the linearity of the power amplifier by suppressing the harmonic component and the intermodulation signal.

Figure 1:
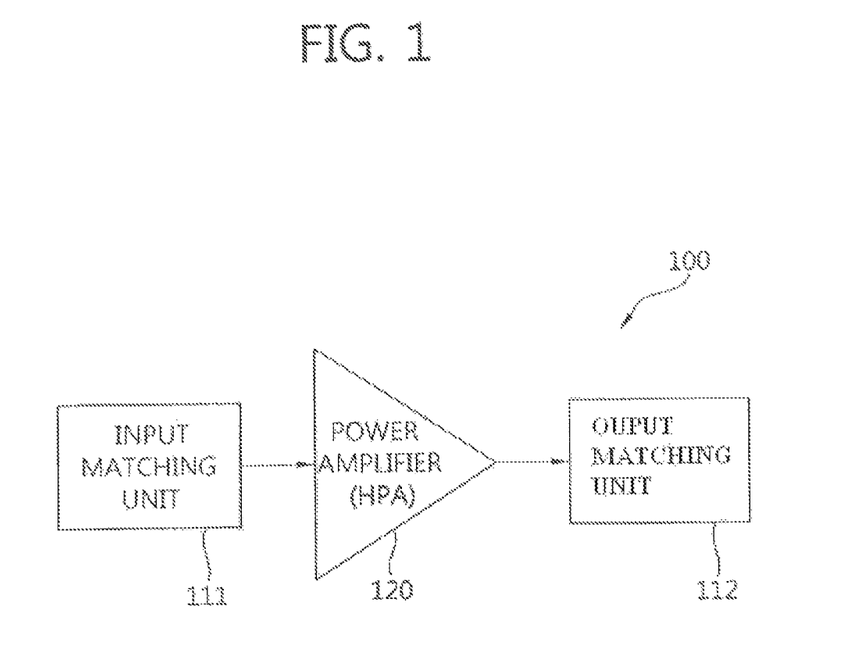
FIG. 1 is a diagram showing a high power amplifier according to an embodiment of the present invention.

FIG. 1 is a diagram showing a high power amplifier according to an embodiment of the present invention.

Referring to FIG. 1, a high power amplifier 100 according to the embodiment of the present invention includes a power amplifier 120 and a matching unit 110. The power amplifier 120 serves to amplify a signal. The power amplifier may include a high power amplifier (HPA).

The matching unit 110 peforms to suppress harmonic components of a signal amplified by passing through the power amplifier 120. The matching unit 110 according to the embodiment of the present invention, which has a two-stage structure, may include an input matching unit 111 and an output matching unit 112. The input matching unit 111 may be positioned at an input terminal of the power amplifier 120 to suppress the harmonic components of the amplifier input signal. The output matching unit 112 may be positioned at an input terminal of the power amplifier 120 to suppress the harmonic components of the amplifier output signal 120.

The input matching unit 111 and the output matching unit 112 may have a composite right/left handed (CRLH) structure. This will be described with reference to FIG. 2.

Figure 2:
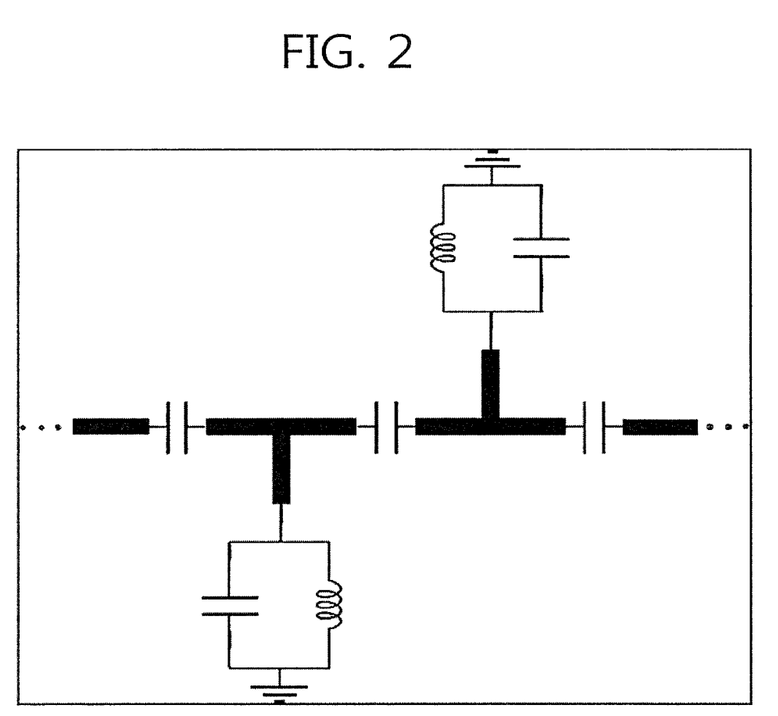
FIG. 2 is a diagram showing a structure of the matching unit according to an embodiment of the present invention.

FIG. 2 is a diagram showing a structure of the matching unit according to an embodiment of the present invention. The shown matching unit may be an input matching unit or an output matching unit.

Referring to FIG. 2, the input matching unit and the output matching unit may be a matching circuit having characteristics of a notch filter having a two-stage CRLH structure. The CRLH structure may basically have meta electromagnetic wave structure characteristics The two-stage CRLH structure may reduce an insertion loss at the central frequency. In addition, a pass band width may be increased. Further, since the two-stage CRLH structure can selectively suppress a particular component of harmonics through the notch filter characteristics, it does not need to have wide band stop characteristics, such that the matching unit can be implemented more efficiently. The characteristics of the high power amplifier including the shown matching unit will be described with reference to FIGS. 3 and 4.

Figure 3:
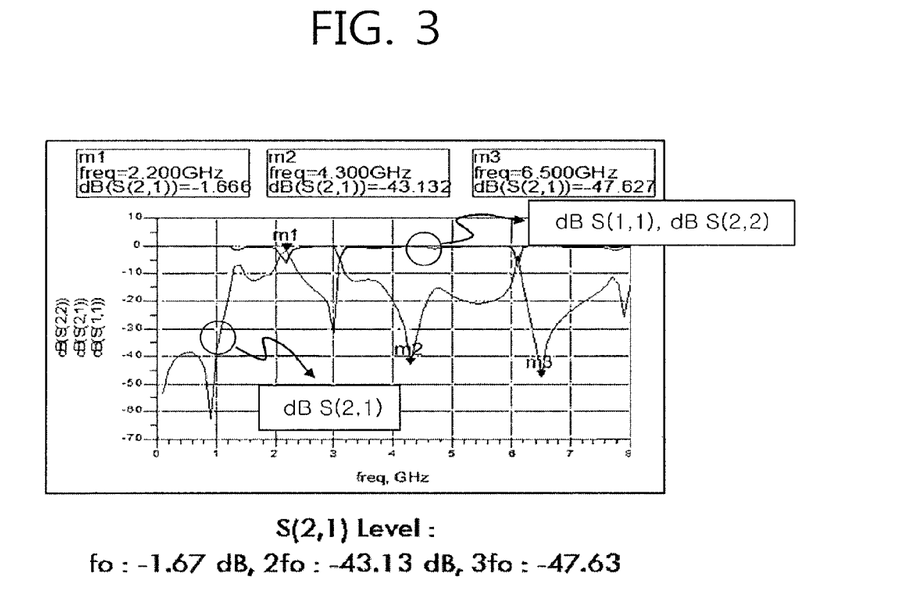
FIGS. 3 and 4 are diagrams showing frequency characteristics of an example of the high power amplifier according to the exemplary embodiment of the present invention.
Figure 4:
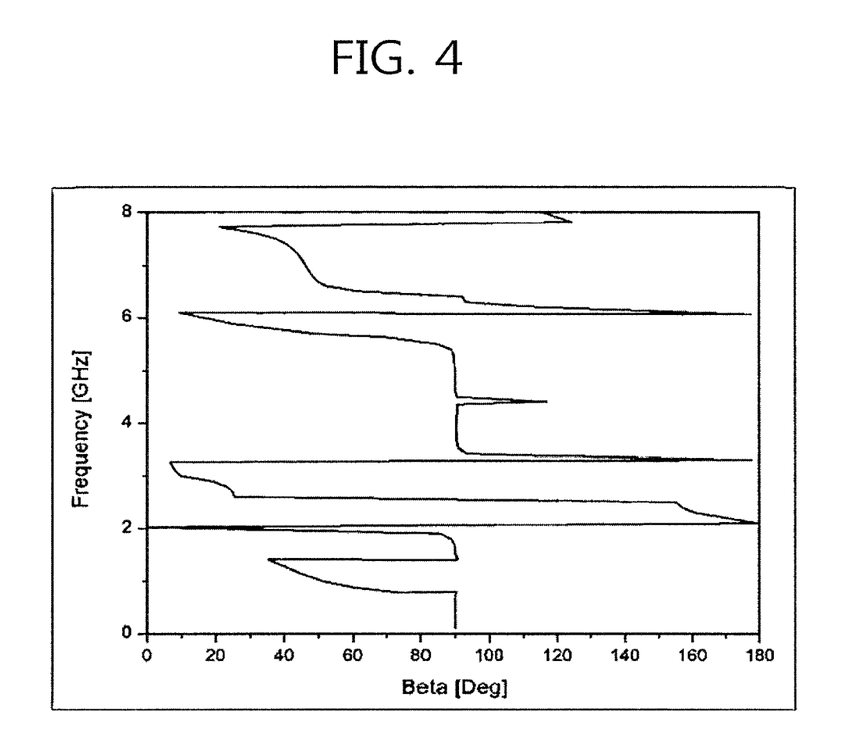

FIGS. 3 and 4 are diagrams showing frequency characteristics of an example of the high power amplifier according to the exemplary embodiment of the present invention.

Referring to FIG. 3, it can be appreciated that the second harmonic component may be suppressed to −43.13 dB and the third harmonic component may be suppressed to −47.63 dB. Comparing with the resonant frequency component, the matching unit according to the exemplary embodiment of the present invention may serve to sufficiently suppress the second and third harmonic components. S(1, 1) and S(2, 2) each represent input and output reflective coefficients. Therefore, as the S(1, 1) and S(2, 2) at the central frequency have a low value, the reflection is not generated, such that the signal passes through the matching stage well. Further, the S(1, 1) and S(2, 2) represent a value of 0 dB at the second and third harmonics and the full reflection is made, such that the signal may be filtered at the matching stage. The matching unit having the CRLH structure may have the meta electromagnetic wave structure. Referring to a graph shown in FIG. 4, it can be appreciated that a phase coefficient is '0' at a resonant frequency of a 2.2 GHz band, which reflects characteristics of a circuit having the meta electromagnetic structure.

Figure 5:
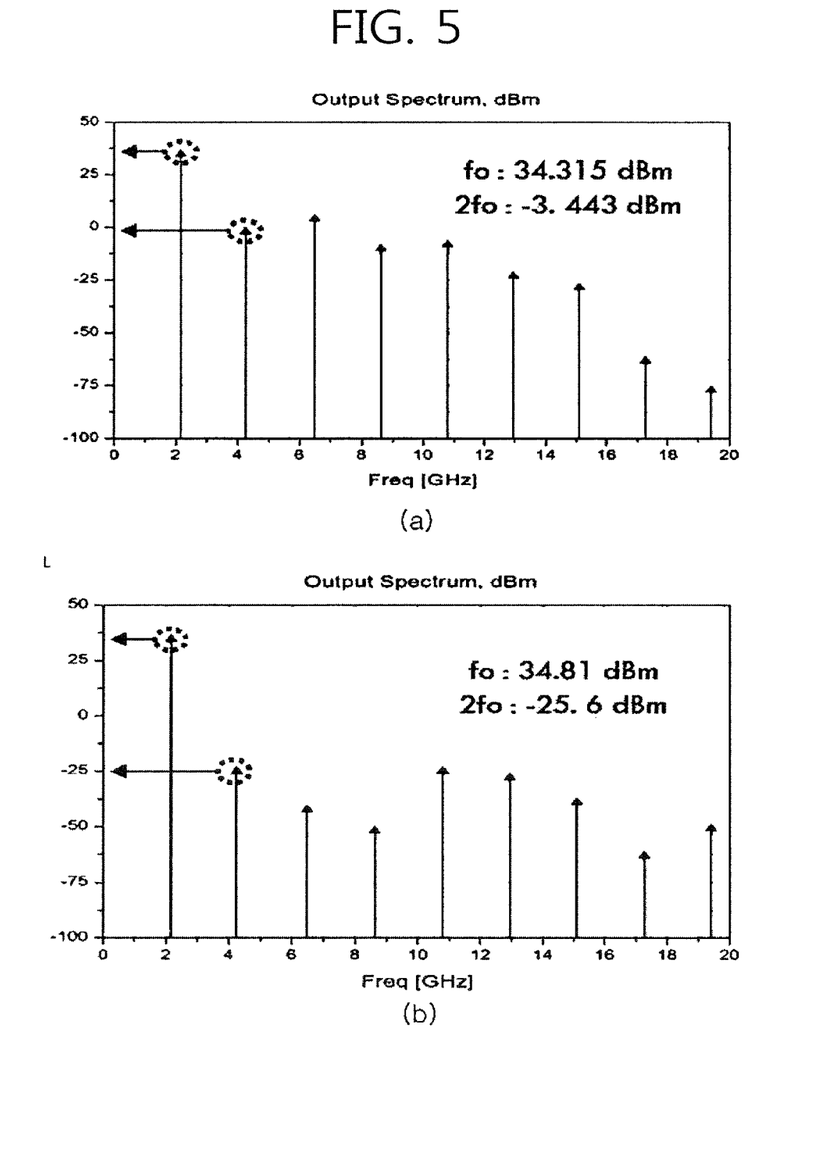
FIG. 5 is a diagram showing a frequency spectrum of a reference amplifier and the high power amplifier according to the exemplary embodiment of the present invention.

FIG. 5 is a diagram showing a frequency spectrum of a reference amplifier and the high power amplifier according to the exemplary embodiment of the present invention. FIG. 5(a) shows the frequency spectrum of the reference amplifier and FIG. 5(b) shows the frequency spectrum of the high power amplifier shown in FIG. 1. The reference amplifier, which is an amplifier implemented by a general L-section matching circuit, is an amplifier schematically implemented to compare the performance between the reference amplifier and the high power amplifier including the matching unit having the CRLH structure according to the exemplary embodiment of the present invention.

Referring to FIGS. 5(a) and 5(b), the spectrum at the resonant frequency band has little difference between two amplifiers. On the other hand, it can be appreciated that the high power amplifier according to the exemplary embodiment of the present invention can more suppress the harmonic component than the reference amplifier. In particular, it can be appreciated that the second harmonic component and the third harmonic component are suppressed above −20 dBc. Therefore, it can be appreciated that the matching unit according to the exemplary embodiment of the present invention can effectively suppress the harmonic component of the amplification signal.

Further, the high power amplifier according to the exemplary embodiment of the present invention may further include a predistortion suppression unit for suppressing the third intermodulation distortion. Similarly to the harmonic component, the intermodulation distortion is also a component showing the non-linearity. Therefore, a need exists for a method for improving non-linearity of an amplifier to approximate characteristics of the high power amplifier to linearity by suppressing the intermodulation distortion. An example of the linearization method may include a back-off method, a feedback method, a feed forward method, a predistortion method, or the like. Among those, the feed forward method and the predistortion method have been most widely used.

The feed forward method greatly improves the non-linearity of the high power amplifier to have the linearity and has been smaller affected by the change in external environment while wider bandwidth, as compared with other methods. However, the delay line loss and the efficiency are low due to the added circuit.

The predistortion method is a method that inserts a non-linear circuit investigating the non-linearity of the power amplifier to be linear to have characteristics opposite to the non-linearity into a front stage of the power amplifier. The characteristics of the amplifier may have more linearity by suppressing the intermodulation distortion of the high power amplifier by the predistortion method. This will be described in more detail with reference to the following drawings.

Figure 6:
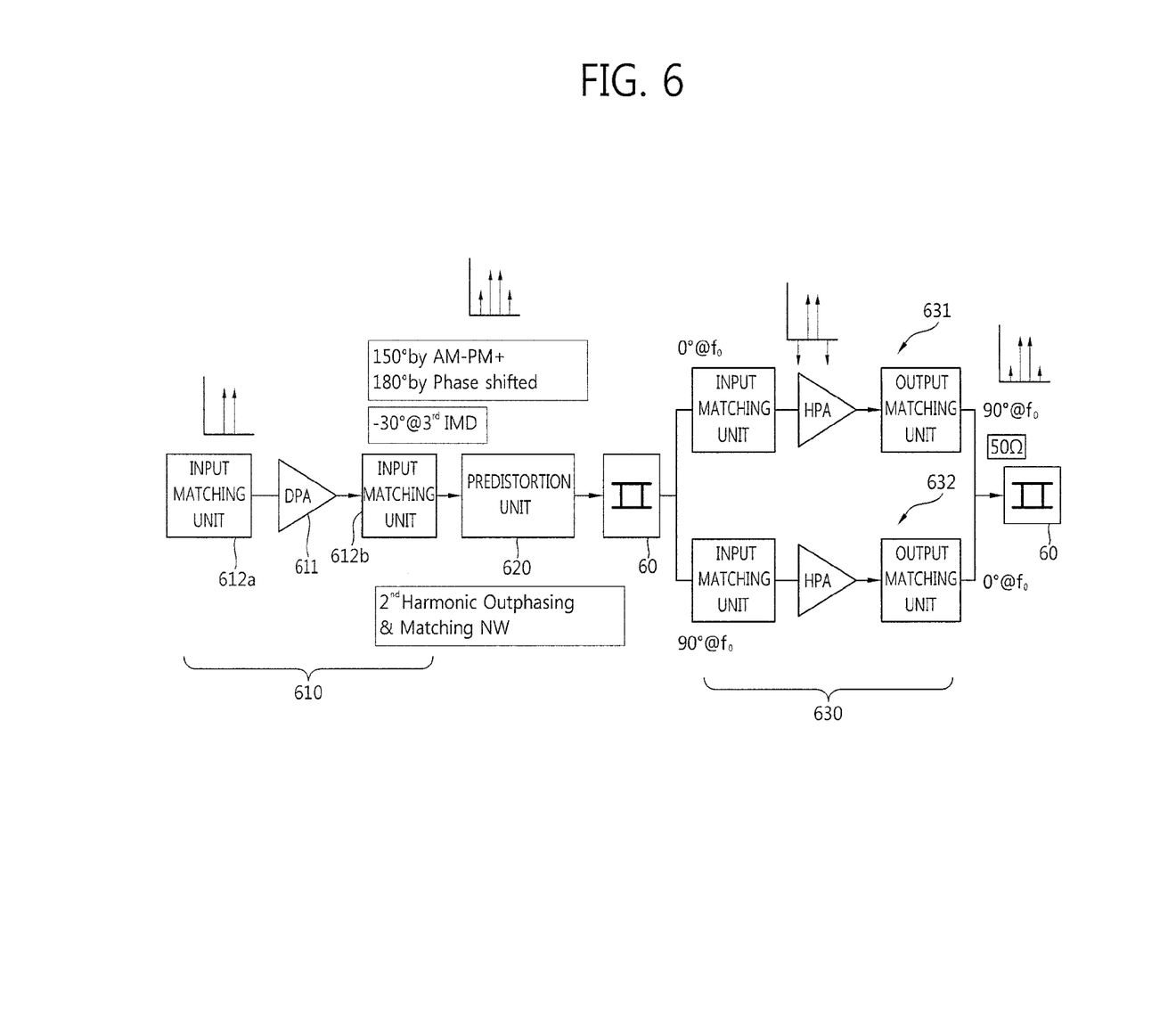
FIG. 6 is a diagram showing a structure of the high power amplifier in which the predistortion suppress unit according to the exemplary embodiment of the present invention is added.

FIG. 6 is a diagram showing a structure of the high power amplifier in which the predistortion suppress unit according to the exemplary embodiment of the present invention is added. In order to differentiate the high power amplifier of FIG. 6 from the high power amplifier of FIG. 1, the high power amplifier of FIG. 1 is referred to as a basic high power amplifier.

Referring to FIG. 6, a high power amplifier 600 includes a driving amplification unit 610, a predistortion unit 620, and an output amplification unit 630. The predistortion unit 620 and the output amplification unit 630 may be coupled with each other through a 3-arm coupler 60 and the two output ends of the output amplification unit may be coupled with each other through the 3-arm coupler 60.

The driving amplification unit 610 may further include a driving power amplifier (DPA) 611 having the high gain so as to drive the high power amplifier supporting high power amplification. In addition, so as to suppress the harmonic component like the basic high power amplifier, matching units 612a and 612b may be provided at the input end and the output end of the driving amplifier 611.

The predistortion unit 620 generates the third intermodulation distortion signal of the signal added with the power gain by the driving amplification unit 610. The function of the predistortion unit 620 may be implemented a phase shifter. The phase shifter shifts the phase of the third intermodulation distortion signal of the output signal passing through the driving amplification unit 610. The phase shifter may be set to shift the phase by 180° at a frequency that is three times higher than the resonant frequency. The phase shifter that may be used for the exemplary embodiment of the present invention may be designed as shown in FIG. 7.

Figure 7:
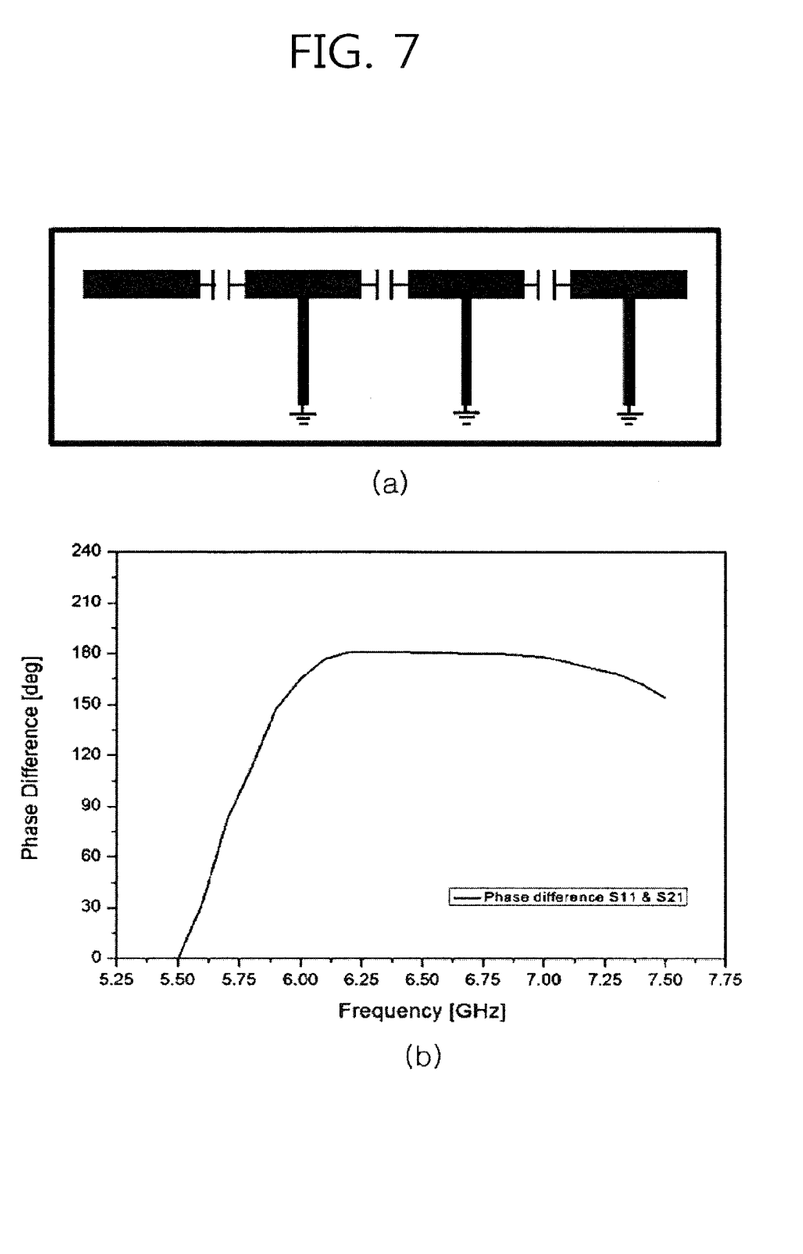
FIG. 7 is a diagram showing characteristics of the phase shifter that may be used for the exemplary embodiment of the present invention.

FIG. 7 is a diagram showing characteristics of the phase shifter that may be used for the exemplary embodiment of the present invention. FIG. 7(a) is a diagram showing a structure of the phase shifter. The phase shifter is configured of a 3 stage such as a series inductor (strip line), a series capacitor, a parallel short stub, or the like. The length of each device and the strip line is designed to be adjusted such that the phase is shifted at each stage and the phase is shifted by 180° at the final output. FIG. 7(b) is a diagram showing a frequency characteristic of the phase shifter. It can be appreciated from FIG. 7(b) that the phase shifter is designed to shift the phase by 180° at the frequency band that is three times higher than the resonant frequency.

The power amplifier 630 may have an equilibrium amplifier structure in which a first power amplifier 631 and a second power amplifier 632 having the structure of the basic high power amplifier shown in FIG. 1 have a parallel structure.

Figure 8:
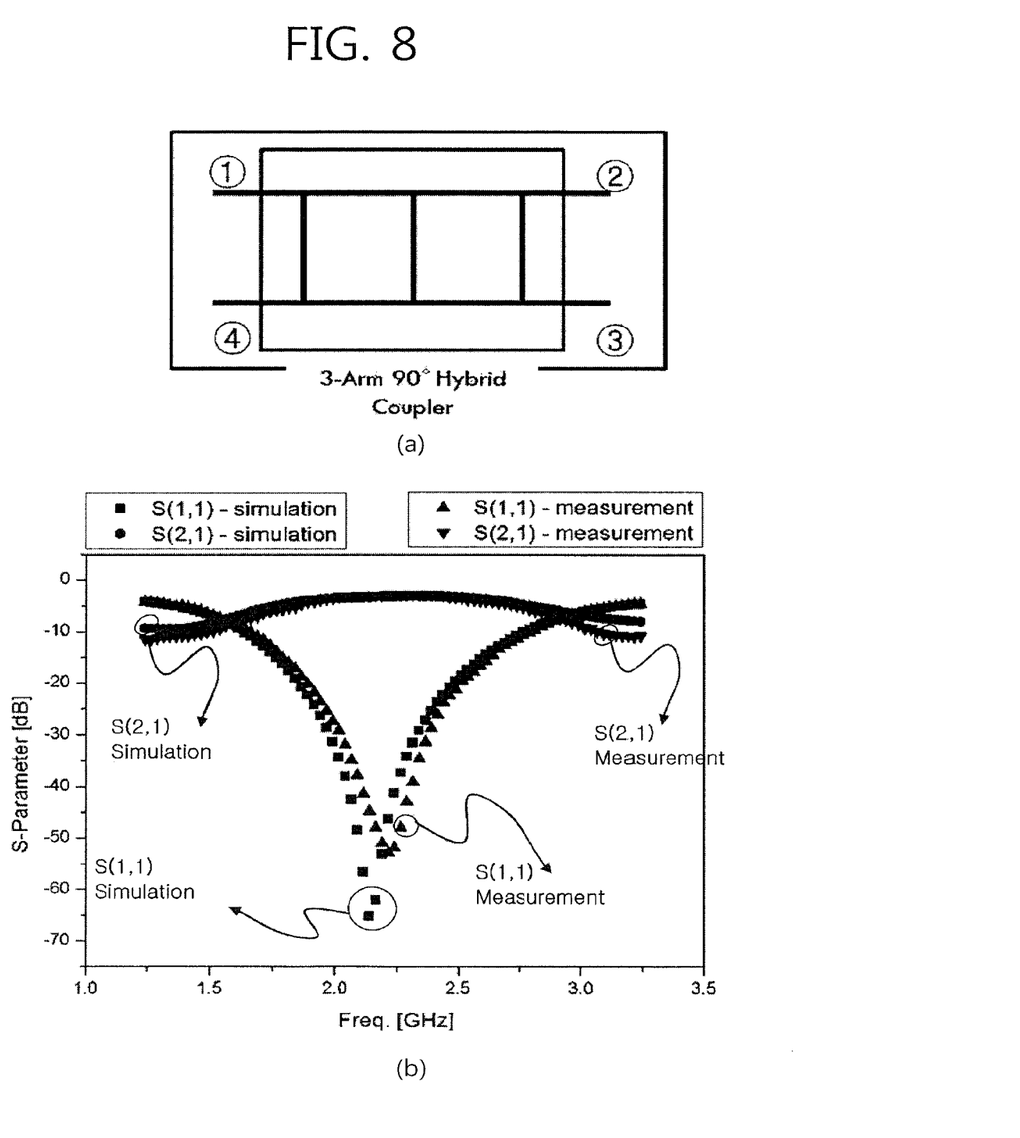
FIG. 8 is a diagram showing a structure and a frequency characteristic of a 3-arm coupler.

The 3-arm coupler 60 is used to couple the driving amplifier unit 610 with the two basic high power amplifiers. The phase at the resonant frequency of the signal output from both output ends of the 3-arm coupler may have a 90° difference. Therefore, the operation frequency components of the signal input to the first power amplifier 631 and the signal input to the second power amplifier 632 may have a phase difference of 90° therebetween. The structure and frequency characteristics of the 3-arm coupler 60 may be described with reference to FIG. 8. The S(1, 1) and S(2, 2) each represent the input reflective coefficient and gain. In FIG. 6B, the S(1, 1) may represent that the reflective loss is minimum to −20 dB or more within a pass band of the central frequency and the S(2, 2) may represent that the signal power input at −3 dB is divided into ½.

Referring to the spectrum shown in FIG. 6, the input signal is amplified in the driving amplifier. However, the third intermodulation distortion component occurs by the non-linearity of the driving amplification unit. In this case, in the phase of the third intermodulation distortion component, the AM-PM distortion occurs through the bias condition of the driving amplification unit and the output matching stage impedance control of the driving amplification unit. The phase may be shifted to have a difference of 150° by controlling the impedance of the bias condition and the impedance of the output matching stage, as compared with the third intermodulation distortion component that occurs at the driving amplification stage. Further, the phase shifter of the output end has the phase shifting of 180° and thus, the phase of the final third intermodulation distortion component is shifted to −30°. The third distortion component may be offset with the third intermodulation distortion component that occurs in the high power amplifier using the same device as the driving amplification unit. Therefore, the spectrum of the final output signal shows the characteristics in which the third intermodulation distortion component is suppressed.

Figure 9:
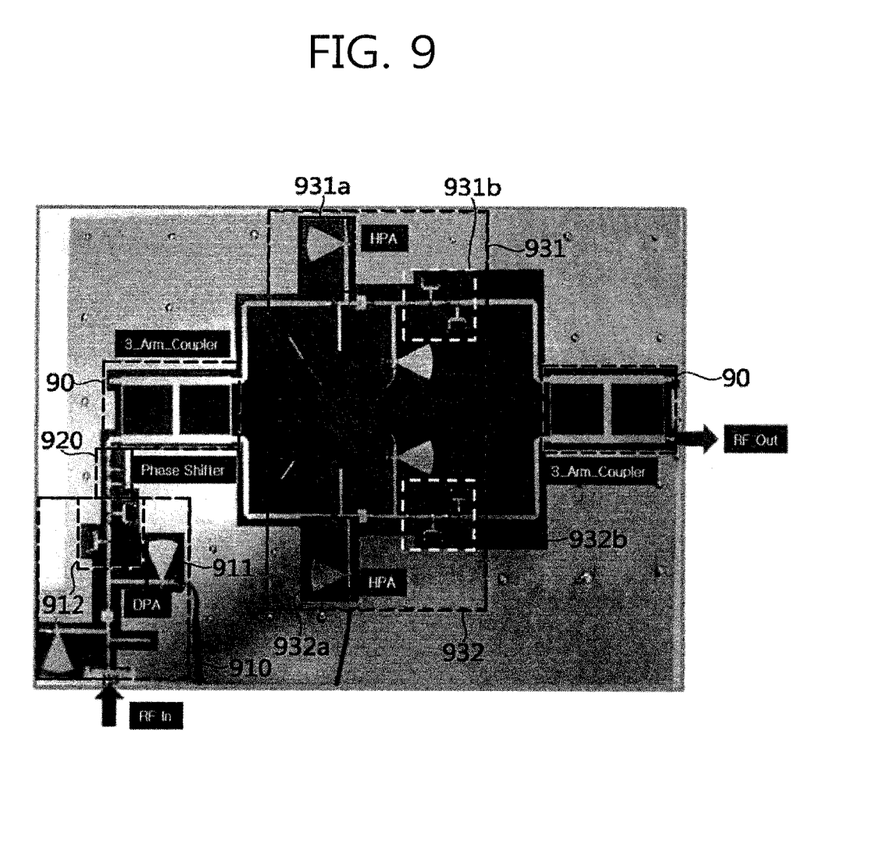
FIG. 9 is a diagram showing the actual implementation circuit of the high power amplifier according to the exemplary embodiment of the present invention.

FIG. 9 is a diagram showing the actual implementation circuit of the high power amplifier according to the exemplary embodiment of the present invention.

Referring to FIG. 9, the RF input signal is input to a driving amplifier unit 910. The driving amplifier is configured of a driving amplifier 911 coupled with a matching stage 912. The driving amplification unit 910 is coupled with a phase shifter 920 and the RF signal in which the phase is changed through the phase shifter is input to a first power amplification unit 931 and a second power amplification unit 932 through the 3-arm coupler 90. The first power amplification unit 931 and the second power amplification unit 932 each have a structure in which power amplifiers 931a and 932a are coupled with matching stages 931b and 932b. The output ends of the first power amplification unit 931 and the second power amplification unit 932 are coupled with the 3-arm coupler 90 and the coupler outputs the RF signal.

Figure 10:
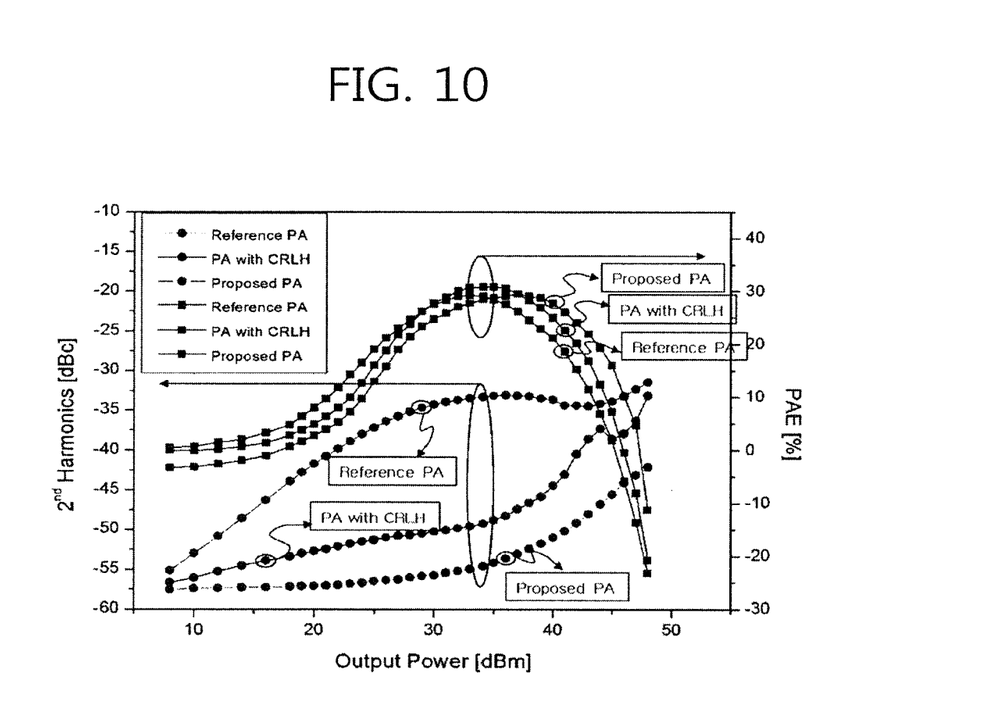
FIG. 10 is a graph comparing the performance between the reference amplifier and the basic high power amplifier and the high power amplifier having the intermodulation distortion suppression unit according to the exemplary embodiment of the present invention.

FIG. 10 is a graph comparing the performance between the reference amplifier and the basic high power amplifier and the high power amplifier having the intermodulation distortion suppression unit according to the exemplary embodiment of the present invention.

Referring to FIG. 10, the efficiency of the basic high power amplifier coupled with the matching stage having the CRLH structure was measured well, as compared with the reference amplifier. Further, it can be appreciated that a difference of 16 dBc is shown at the maximum output point 34 dBm in terms of the second harmonic suppression.

Further, the maximum output point of the high power amplifier to which the intermodulation distortion suppression unit is added was measured as 37 dBm that is 3 dB above the maximum output point of the reference amplifier and the basic high power amplifier. In this case, it can be appreciated that the harmonic suppression is improved by 22 dBc as compared with the reference amplifier and by 5 dBc as compared with the basic high power amplifier. It can be appreciated that the efficiency is slightly lower than that of the basic high power amplifier to which the CRLH structure is applied, but is improved as compared with the reference amplifier. The detailed results of measuring the performance of each amplifier may refer to the following Table 1.

TABLE 1

|  | Reference Amplifier | Basic Amplifier | High Power Amplifier (Intermodulation Distortion Suppression) |
|---|---|---|---|
| Operating Frequency | 2.1575 GHz | 2.1575 GHz | 2.1575 GHz |
| Output Power | 33.46 dBm | 34.27 dBm | 36.98 dBm |
| Power Gain | 10 dB | 9.6 dB | 21.6 dB 21(DPA) + 9.6(HPA) |
| Second Harmonic | −33.2 dBc | −49.4 dBc | −53.dBc@$P_{1\,dB}$ |
| PAE (Power Added Efficiency) | 28.8% | 31.7% | 29.4% |

The exemplary embodiments of the present invention can improve the linearity of the high power amplifier by suppressing the second and third harmonics of the high power amplifier using the composite right-left handed (CRLH) matching circuit.

Further, the exemplary embodiments of the present invention can improve the linearity of the high power amplifier by using the predistortion unit suppressing the third intermodulation ($3^{rd}$ IMD) distortion.

The above-mentioned embodiments include examples of various aspects. Although all possible combinations showing various aspects are not described, it may be appreciated by those skilled in the art that other combinations may be made. Therefore, the present invention should be construed as including all other substitutions, alterations and modifications belonging to the following claims.

What is claimed is:

1. An amplifier, comprising:
   a predistortion unit suppressing intermodulation distortion; and
   a power amplification unit amplifying power of an amplification target signal passing through the predistortion unit,
   wherein the power amplification unit has a parallel amplifier structure in which a first amplification unit and a second amplification unit are coupled with each other in parallel,
   the first amplification unit and the second amplification unit each include:
   an input matching unit suppressing harmonic components of the amplification target signal;
   a high power amplification unit amplifying a signal suppressed by the input matching unit; and
   an output matching unit suppressing the harmonic components of an output signal amplified by the high power amplification unit,
   wherein the predistortion unit includes a phase shifter that shifts a phase of third intermodulation distortion component of a signal input to the predistortion unit by 180°.

2. The amplifier of claim 1, wherein the input matching unit and the output matching unit have frequency characteristics of a notch filter.

3. The amplifier of claim 2, wherein the input matching unit and the output matching unit have a meta electromagnetic wave structure.

4. The amplifier of claim 3, wherein the input matching unit and the output matching unit have a composite right/left handed (CRLH) structure.

5. The amplifier of claim 3, wherein the input matching unit and the output matching unit have a two-stage CRLH structure.

6. An amplifier, comprising:
   a driving amplification unit comprising a driving power amplifier and matching units provided at the input end and the output end of the driving amplifier;
   a predistortion unit shifting the phase of a third intermodulation distortion signal of an output signal passing through the driving amplification unit; and
   an output amplification unit comprising a power amplification unit amplifying power of an amplification target signal passing through the predistortion unit,
   wherein the power amplification unit has a parallel amplifier structure in which a first amplification unit and a second amplification unit are coupled with each other in parallel,
   the first amplification unit and the second amplification unit each include:
   an input matching unit suppressing harmonic components of the amplification target signal;
   a high power amplification unit amplifying a signal suppressed by the input matching unit; and
   an output matching unit suppressing the harmonic components of an output signal amplified by the high power amplification unit.

7. The amplifier of claim 6, wherein the predistortion unit and the output amplification unit are coupled with each other through a 3-arm coupler.

8. The amplifier of claim 6, wherein two output ends of the output amplification unit are coupled with each other through a 3-arm coupler.

9. The amplifier of claim 6, wherein the predistortion unit includes a phase shifter that shifts a phase of third intermodulation distortion component of a signal input to the predistortion unit by 180°.

10. The amplifier of claim 6, wherein the input matching unit and the output matching unit have frequency characteristics of a notch filter.

11. The amplifier of claim 10, wherein the input matching unit and the output matching unit have a meta electromagnetic wave structure.

12. The amplifier of claim 10, wherein the input matching unit and the output matching unit have a composite right/left handed (CRLH) structure.

13. The amplifier of claim 12, wherein the input matching unit and the output matching unit have a two-stage CRLH structure.

* * * * *